United States Patent [19]

Wilson

[11] Patent Number: 5,471,651
[45] Date of Patent: Nov. 28, 1995

[54] METHOD AND SYSTEM FOR COMPRESSING THE DYNAMIC RANGE OF AUDIO SIGNALS

[75] Inventor: Stephen G. T. Wilson, Carnforth, United Kingdom

[73] Assignee: British Broadcasting Corporation, London, United Kingdom

[21] Appl. No.: 949,244

[22] PCT Filed: Mar. 20, 1992

[86] PCT No.: PCT/GB92/00502

§ 371 Date: Nov. 13, 1992

§ 102(e) Date: Nov. 13, 1992

[87] PCT Pub. No.: WO92/16996

PCT Pub. Date: Oct. 1, 1992

[30] Foreign Application Priority Data

Mar. 20, 1991 [GB] United Kingdom .................. 9105896
Mar. 21, 1991 [GB] United Kingdom .................. 9106014

[51] Int. Cl.⁶ .............................. H03G 7/00; H04B 1/16
[52] U.S. Cl. ......................... 455/72; 455/235.1; 333/14; 381/106
[58] Field of Search ....................... 455/72, 127, 235.1, 455/250.1; 307/264; 370/7; 328/168, 169, 173; 381/106; 333/14

[56] References Cited

U.S. PATENT DOCUMENTS 4,271,499   6/1981   Leveque .
5,241,689   8/1993   Schwed .................................. 455/72

FOREIGN PATENT DOCUMENTS 0342686   11/1989   European Pat. Off. .
380184A1   9/1988   Germany .
2179810    3/1987   United Kingdom .
2201310    8/1988   United Kingdom .

OTHER PUBLICATIONS

Patent Specification, Appl. No. 12050/77, Filed Mar. 1977, Thomas, Louis David, "Input Signal Level Control For Communications Channels" (GB 1,599,401).

*Primary Examiner*—Edward F. Urban
*Assistant Examiner*—Chi H. Pham
*Attorney, Agent, or Firm*—Kevin J. Fournier

[57] ABSTRACT

An audio signal has its dynamic range compressed by a system which first samples a block of the audio signal (10), typically several seconds long. The level of the signal in this block is analyzed (12, 14) and an ideal signal level is calculated for the block (16, 18, 20). A gain control signal is then derived which adjusts the gain applied to that block towards that required to give the calculated ideal signal level.

33 Claims, 4 Drawing Sheets

METHOD AND SYSTEM FOR COMPRESSING THE DYNAMIC RANGE OF AUDIO SIGNALS

FIELD OF THE INVENTION

This invention relates to dynamic range compression of audio signals and is suitable for use with conventional AM and FM broadcasts of audio signals and with high quality digial audio broadcasts (DAB).

BACKGROUND OF THE INVENTION

In conventional AM and FM audio transmission there is a substantial amount of background noise. For this reason, signals at a very low amplitude (quiet signals) are amplified so that they are substantially above the residual noise level of the transmission and are thus audible at a receiver. If this amplification were applied to the whole signal then the amplitude of relatively high amplitude (loud) signals would be unacceptably high. Thus the amplification (gain) has to be reduced in the loud portion, i.e. the dynamic range of the whole signal has to compressed by raising the level of quiet signals and reducing the level of loud signals. Not all broadcast programmes have a wide dynamic range and it is often considered satisfactory to permit the limiters which prevent over-modulation of transmitters to compress the programme dynamics by controlling peaks. Sometimes proprietary compression equipment is employed prior to the limiter. However, these devices have an obtrusive effect on "serious" music. Dynamic range compression of serious music is usually done by a studio manager who is, for example, familiar with the piece of music which is to have its dynamic range compressed and can make unobtrusive adjustments. With current broadcasting standards a hi-fi enthusiast cannot receive the full dynamic range of a piece played on high quality source materials at the studio, such as compact disc, because of the limitations of the broadcast medium, necessitating a degree of compression. This represents a compromise between different listeners' requirements. Sometimes the degree of compression is varied during the day in dependence on whether the majority of the audience are expected to be at home or in their cars. Whatever approach is adopted it is not possible to satisfy all listeners all of the time.

Digital audio broadcasts will have an ancilliary data channel associated with them and it has been proposed that this could carry dynamic range or compression related information. Thus it would be possible for receivers to be equipped with circuitry which could adapt the dynamic range of the signal to the listeners requirements. For example, a signal transmitted with full dynamic range could be transmitted together with a compression control signal with which the receiver could, if so instructed by the listener, compress the dynamic range by up to, say 20 dB. Alternatively a compressed signal could be broadcast and listeners with hi-fi receivers could set their receivers to re-expand the signal dynamics by part or all of the compression. The compression control signal could be sent with a fixed rate of, for example, 24 bits per second.

SUMMARY OF THE INVENTION

A technique has been developed for dynamic compression of signals using digial signal processors (DSPs) rather than a studio manager. This can be used to compress the dynamic range of a signal and also provide a control signal indicating the degree of compression. The broadcaster can then transmit either the original signal and the control signal or the compressed signal and the control signal. The receiver can then perform compression or re-expansion of the signal as required.

Preferred embodiments of the present invention provide a system for compressing the dynamic range of a signal which will closely approach the actions of a studio manager. In particular the system looks ahead in the recorded material to a point substantially in advance of the audio samples being replayed and makes relatively gradual gain adjustments up or down.

Conventional equipment for dynamic range compression incorporates only a very short look-ahead time into the signal, typically of the order of a few milliseconds. Thus the alteration in gain of the signal is effected as changes in the amplitude of the signal occur and the process essentially comprises a straightforward gain follower making rapid gain adjustments according to a predetermined compression law. There is no scope in such techniques for looking further ahead into a signal to detect when a crescendo is approaching or when a gradual falling of the amplitude of the signal is approaching. Thus the processing is not able to imitate the action of a studio manager.

A typical look ahead time for the dynamic range compression technique of the invention would be three seconds. However, the system takes some twenty seconds or so to raise the level of a pianissimo passage or to reduce the level of a fortissimo, unless a dynamic change in the programme from pianissimo to fortissimo is very rapid, e.g. a change in less than three seconds, in which case a more rapid adaptation overrides the gradual change.

The use of this process implies the introduction of a delay of 3 seconds into the programme chain from the CD player. This could be avoided by linking the processor with the CD control circuits to "cue up" the player 3 seconds in advance, with the first 3 seconds of audio held in the processor's data buffer.

Table 1 summarises a number of options for full and reduced dynamic range available to the broadcaster, with the compressed data signal with the implicit advantages and disadvantages of each option when applied to the entire programme output (not just to Compact Disc, or other recorded material with a wide dynamic range).

TABLE 1

| Options | Advantages (+) and Disadvantages (−) |
|---|---|
| Compromise between full & reduced range | Does not satisfy all listeners (−)<br>Full dynamic range is not exploited (−) |
| Full dynamic range with control signal | All listeners can be satisfied (+)<br>Full range is available to all listeners with no extra receiver processing (+)<br>Listeners requiring reduced dynamic range need extra processing in receiver (−)<br>Delay (3s) introduced into all transmissions whilst control signal is being derived (−) |
| Reduced dynamic range with control signal | All listeners can be satisfied (+)<br>Full range is available to listeners with Hi-Fi receivers (extra processing) (+)<br>Reduced dynamic range is available to all listeners with no extra processing (+)<br>Dealy (3s) introduced into all transmissions by dynamic compressor (−) |
| Full dynamic range with no control signal | Full range is available to all listeners (+)<br>Listeners requiring dynamic range need even more processing in receiver (−)<br>No additional delay in transmissions, but receivers reducing the dynamic range |

TABLE 1-continued

| Options | Advantages (+) and Disadvantages (−) |
|---|---|
| | introduce 3s delay (+) |

The first option, that of compressing all signals to a degree which represents a compromise between the full and reduced dynamic range requirements, offers only disadvantages. Most importantly, it denies all listeners the ability to enjoy the full dynamic range which would otherwise be available.

Both the second and third options introduce delay, which can cause problems Gilchirst, N.H.C., 1991. Delay in broadcasting operations. AES 90th Convention (Paris 1991). AES Preprint No. 3033. The extent to which broadcasters and listeners may be able to live with these problems has not been determined. However, both the full dynamic range, and a reduced dynamic range achieved using an "artistic" compression process, may be made available to the listener. If the full dynamic range is broadcast, many (possibly all) portable and mobile receivers will need to incorporate compression processing; in practice this means that most receivers will incorporate the extra processing. If the compressed programme is broadcast, probably only the Hi-Fi receivers will need the extra processing.

The last option, that of transmitting the full dynamic range of the programme with no control signals is operationally very attractive to the broadcaster, because no additional delay is introduced into the broadcasting chain prior to the receiver. Because the same high-quality signal is available to the receiver as exists at the broadcasting centre, the receiver could, conceivably, use the same "artistic" dynamic compression method to reduce dynamic range. However, the extra complexity required in the receiver might be prohibitively expensive. If so, it could lead to the adoption of inferior compression algorithms.

If one assumes that the dynamic range of "live" programme material originated by the broadcasters is satisfactory for all listeners, and that it is only recorded material with a wide dynamic range (such as CD) which may require the dynamic range to be reduced, the options listed in Table 1 could be considered to apply only to CD and similar recorded material. Most of the advantages and disadvantages would still apply, but the delay mentioned in the second and third portions would no longer be significant because it would be introduced only during the replay of recorded material. In the case of the fourth option, the receiver would either need to incorporate a delay permanently (typically 3 seconds) or switch the delay in and out, as required. The former arrangement would delay all audio signals and there would be delays before the programme changed on selecting a new transmission,and on switching "on"; the latter risks the loss of a few seconds of programme whenever the compression process is switched off.

All the options have advantages and disadvantages, and the best choice will depend upon factors such as the cost of processing in the receiver and the importance or inconvenience of delay.

The invention is defined in its various aspects in the appended claims to which reference should now be made.

A more detailed description of the preferred dynamic range compression system will now be given, with reference to the drawings, in which:

DESCRIPTION OF THE PREFERRED EMBODIMENTS

The method of dynamic range compression of the present invention can be implemented in Digital Signal Processor (DSP) based hardware in a manner which will be clear to a man skilled in the art.

The method attempts to copy the rules and behaviour of a studio manager by looking ahead with a "window" into the audio data which is to be compressed. This is done by passing the audio data through a delay so that as the gain at a instance in time, t0 is being calculated, the programme can see the volume levels or sound for a period beyond t0. The method is implemented with a series of rules and "motivations" with different priority assigned to them. The greatest priority is, clearly, to prevent the audio reaching the levels where external limiters would cut in, in a conventional system or where peak clipping and consequent severe distortion would occur in a digital system.

Figure 1A:
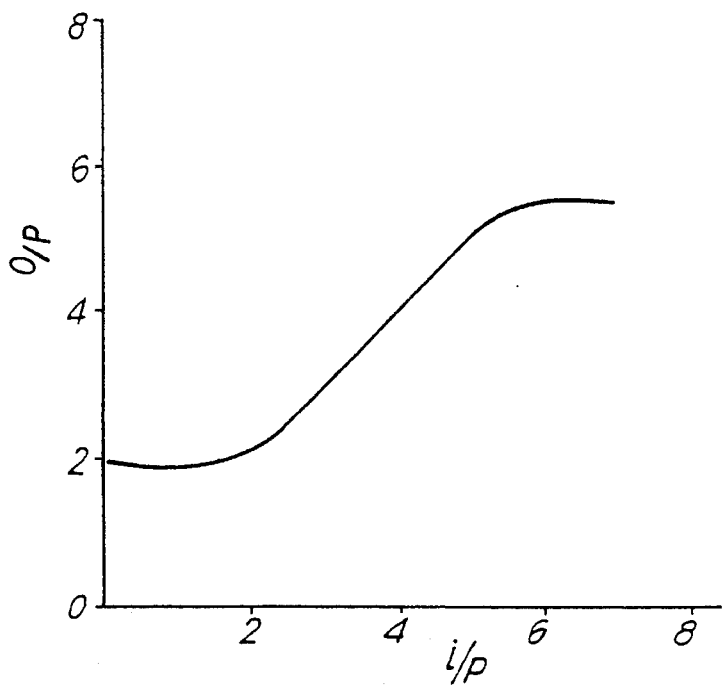
FIGS. 1(a), 1(b) and 1(c) show three dynamic range compression laws.

The method works by using a preset compression law to calculate the ideal gain for a "window" or block of the audio data. Examples of such compression laws are shown in FIGS. 1a), b) and c). These give desired output levels for given input levels. The method works by looking ahead with a window into the audio data so that the DSP has reasonable warning of sound levels approaching. The DSP is then able to commence adjusting the gain so that a smooth transition is made when some change in gain is needed either to stop a peak level exceeding a predetermined upper limit or to stop a low level signal disappearing into noise. Usually such a method enables audio data to be compressed whilst taking account of the transient dynamics of the audio signal.

Figure 1B:
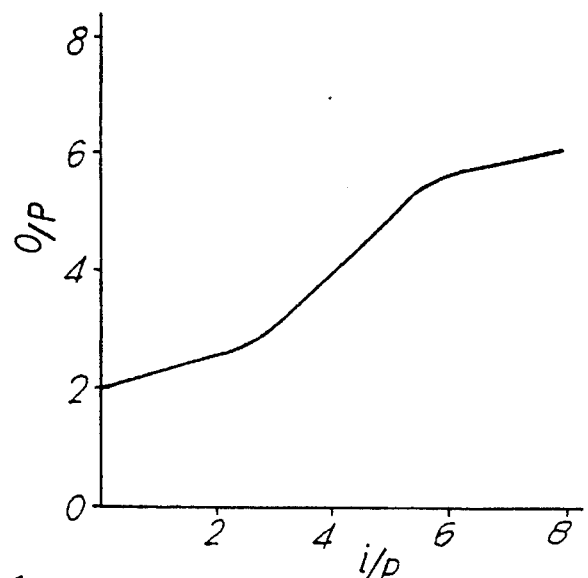
Figure 1C:
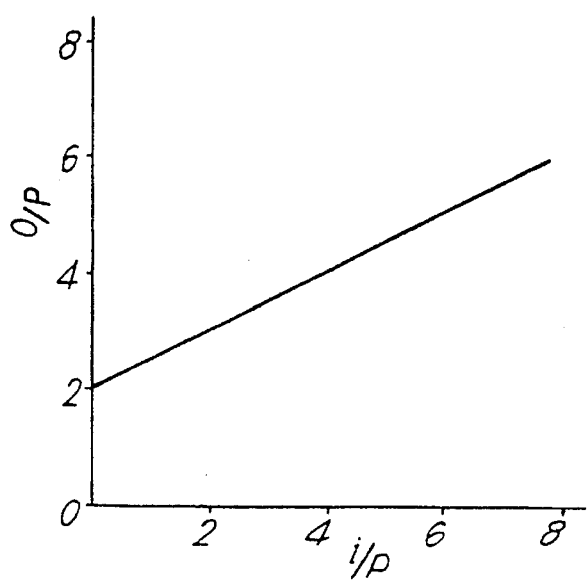

The method operates by first looking at the block of sound in the window, provided by a delay, to calculate the peak level of the sound in that window. It then uses a preset compression laws, for example those shown in FIGS. 1(a)–1(c), to calculate the ideal gain for the peak level. If the peak level exceeds a predetermined upper limit then the gain is decreased to keep the peak under the limit when it arrives. In normal circumstances the gain is slowly adjusted to the ideal value derived from the compression law. The gain can be adjusted to reach its ideal level either as the peak level is reached, as the end of the block is reached, or at some later time after that block has been played. In circumstances where the peak level is not going to reach the predetermined upper limit the method can be arranged to adjust the gain gradient applied to the output signal to help maintain the transient dynamics of the music. For example, the gain may be held flat if the dynamics are in danger of impairment.

Preferably, in order to smooth the gain changes, a lag is imposed on the gain gradient in excess of the delay used to sample the window into the sound file. Thus the rate of increase of gain produced by the gain control signal is such that the ideal gain for the window will not be reached until after that window has been transmitted.

One idea which appears logical is the idea of applying compression relative to the maximum peak in a piece of music and then "range lifting" so that the whole of the compression piece is placed in the optimum part of the dynamic range. This idea is inappropriate because it takes no account of the character of the music being processed. A quiet sonata with reasonably small dynamic range may be placed within the Studio Managers' guidelines by applying a constant gain throughout. The problems occur when the item begins to sound unnaturally loud. Items with a lot of quiet vocals suffer particularly, as a quiet voice has different tonal characteristics to a loud voice, and so, not only does the volume of the voice not match the character of the piece, but the voice may sound unnatural at that volume. Because of this range lifting the piece to the loudest part of the dynamic range is a bad idea. A better imitation of the Studio Managers' guidelines is obtained by using as little gain changing as possible.

One thing that is apparent is that there is a large discrepancy between the volume of a pulsed note calculated digitally and the displacement of a peak programme meter (PPM). When a sustained note of constant volume is applied, the relationship between the digital peaks and the ppm readings is easy to define. However, when a note has a short duration (<100ms), the reading on a PPM is much lower than that for the same note sustained indefinately. The new method synthesizes the characteristics of a PPM very well, with a discrepancy which is negligible in this application.

The preferred first and second level rules of a method embodying the invention are summarised below.

First Level Rules and Priorites That Govern Gain Adjustments

1. If an approaching peak in the window will go over the upper PPM limit at the present gain, adjust the gain smoothly, so that the peak will just fit inside the upper limit.
2. For all other levels the gain is adjusted smoothly towards the ideal gain calculated from the predetermined compression law as determined for the peak volume in the window (see FIGS. 1(a)–1(c).

Second Level Rules

These rules are superimposed on the first level rules in order to try and minimise any impairment to the transient dynamics of an item which is being compressed.

1. If the volume is not going to go over the uper PPM limit then the gain will be held flat during transient increases in volume. This applies even when a gain reduction is already in progress.
2. The gain will be held flat during transient decreases in volume to help prevent unnatural sustaining of notes. This applies even when an an increase in gain is in progress.

The following are features which arise from the use of methods and systems embodying the invention.

1. Definable compression law: The relationship between input and output levels for sustained tones can be defined in terms of PPM values to enable the most musically acceptable compression law to be used.
2. Internal PPM synthesizer: The method incorporates an internal PPM synthesizer to enable the levels to be specified for the compression law.
3. Maximum upward and downward gain gradient restriction: Present maximum upward and downward gain gradient restrictions of typically 72 dB/min prevent the method from changing the gain too rapidly except when the sound level is about to go over the predetermined upper limit. A rate of change of ½ dB per second has been found to give good results for a typical gain gradient.
4. Automatic calculation of gain gradient: The method automatically calculates the gain gradient needed to perform the dynamic range compression, changing the gain as slowly as possible.
5. Limiter to prevent clipping occuring: If the method's PPM-related volume calculations miss a sharp spike in the sound data, a limiter ensures that no clipping will occur inside the processing loop by limiting the signal peaks over a period of 0.25 of a second.
6. Lagging to smooth the gain profile: The method adds lagging to the gain gradient, which helps to minimise the impairment of transient dynamics outside the compression limits. The gain gradient changes a certain fraction of the difference between the previous value and the calculated one.
7. Compression of "live" programmes, with a delay of, for example 3 seconds: All the gain calculation and output generation are done inside one main processing loop that incorporates a few seconds delay, wihout the need for an audition of the entire item beforehand, so that the method can be easily realised as a unit for installation in a system performing compression "live" in the studio or broadcasting centre.
8. Setting of a default gain signal at the start of an item: A default setting is programmed into the system to give a gain which should accomodate the starting signal levels of most items to be compressed.

Figure 3:
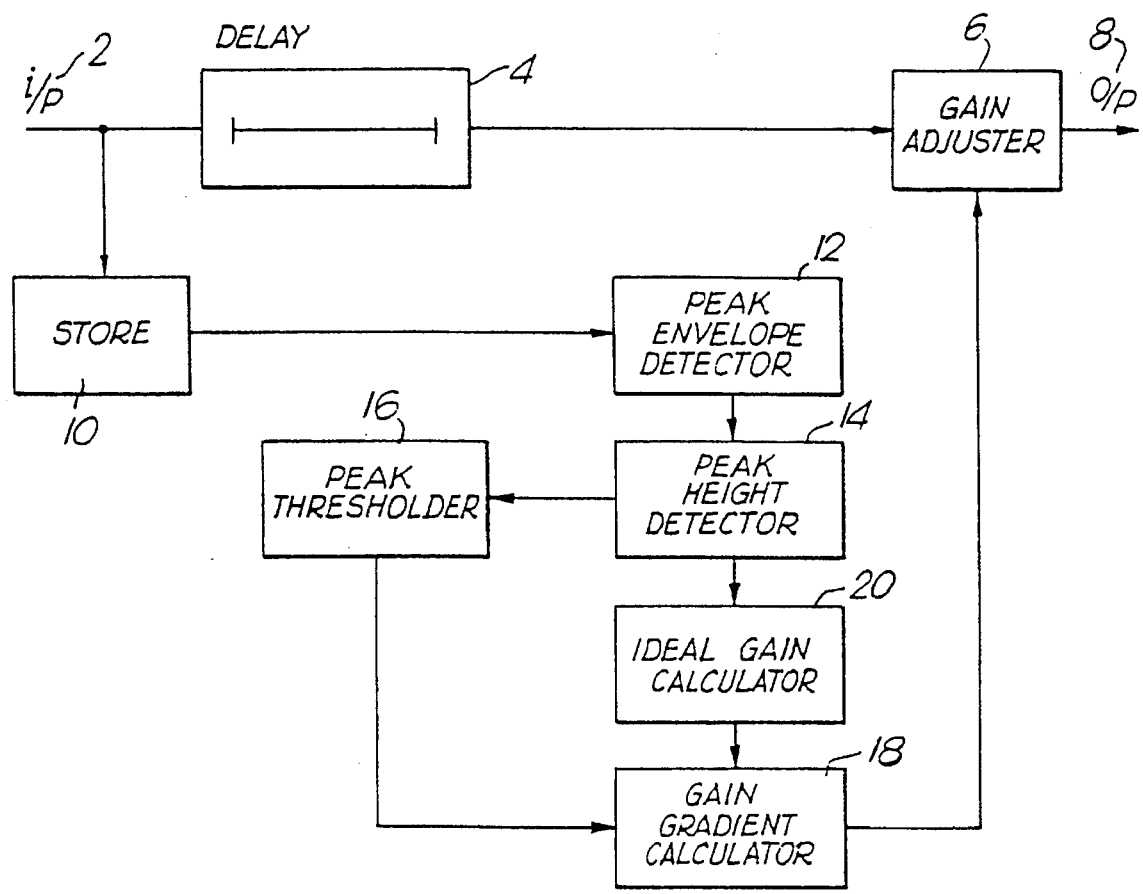
FIG. 3 shows a block diagram of a system embodying the invention.

A block diagram of a system embodying the invention is shown in FIG. 3 and this comprises an input signal 2 which is fed to a delay 4. The output of this delay 4 provides the input to a gain adjuster 6 which also receives a gain adjustment signal via another input and provides a gain adjusted output 8. A store 10 is coupled to the input 2 and this stores a block of data at least as long as the delay imposed by the delay 4. This will typically be three seconds long. Audio data received by the input 2 is read into the store 10 in smaller blocks of, for example, 0.25 seconds duration. As each block is read in, the existing blocks are shuffled through the store with some being lost at its end.

A peak envelope detector 12 generates an array which will be PPM related to the signal level in the block, i.e. the digital level of a sustained sine wave at 1 kilohertz that would give the same PPM reading as the block. The characteristics of a PPM are synthesised by simulating the delay and release times of a PPM. The one thing that is not simulated, however, is the overshoot characteristic of the PPM, so that when the system is processing music with a lot of short duration peaks there may be a discrepancy between the real and synthesised PPM values of up to 0.5 dB.

A peak height detector 14 performs a window scanning routine which runs through delayed audio from the store 10 and finds the first peak envelope to go over a predetermined upper limit using the present gain produced by the system. The location of this point is recorded, as is the location and size of the highest peak in the window. A peak thresholder 16 is used to determine when peaks exceed the predetermined upper limit.

If a peak does exceed the predetermined upper limit, its position in the block is supplied to the gain gradient calculator 18 by the peak thresholder 16 whilst an ideal gain calculator 20 computes, according to the applicable compression law, what adjustment should be made to the gain to prevent the peak exceeding the predetermined limit.

The gain gradient calculator 18 then calculates the rate of adjustment which needs to be made to the gain and provides a control signal to the gain adjuster 6 to make the necessary adjustment.

This ensures that by the time the first peak to go over the predetermined upper limit arrives at the output, the gain has already been brought down to the level needed to bring the highest peak in the window under the predetermined limit.

If, on the other hand, the highest peak in the window is less than the predetermined upper limit at the existing gain setting then its location and magnitude are passed directly onto the ideal gain calculator 20 and the gain gradient calculator 18. These then compute the required rate of gain adjustment for the gain adjuster 6. This control signal for the gain adjuster 6 the gain to move gradually towards the ideal gain for the window. It can be set to move at any rate desired towards this ideal gain but preferably it takes at least as long as the sampled window duration.

The ideal gain calculator 20 operates by using a preset compression law, examples of which are given in FIGS. 1(*a*)–1(*c*). The input value of a signal at the present gain setting is compared with a series of points for which the input/output relationship is defined. The ideal gain is found by interpolating the relationship between them.

In the unusual situation that the maximum peak in the window is below the noise threshold of the input signals then the ideal gain is defined as zero. The gain gradient calculator 18 uses the output value of the ideal ,gain calculator 20 and time (distance) information generated by the peak height detector 14 when it scans the window of audio data, and in response to this generates a logarithmic gradient in decibels per block length. This gain gradient is then checked to be within the preset gain limits, and may be zeroed if the system is in danger of impairing the dynamics of the music, i.e. if the polarity of the gain gradient is moving in an opposite direction to the instantaneous envelope of the sound data. The gain gradient calculator 18 holds the gain flat in such circumstances.

A further delay can be provided between the gain gradient calculator 18 and the gain adjuster 6 to include an additional delay in gain adjustment.

A new gain is then calculated from the gain setting currently on the gain adjuster 6 and the gain gradient. There is no limit on the attenuation that can be applied to the gain but a maximum, say 10 dB, is satisfactory for most applications. The gain is also limited if it is in danger of causing clipping inside the digital domain.

Because of the shuffling of 0.25 seconds blocks of data into the store 10 the gain gradient being applied varies throughout the delay period and the gain gradient to be applied to each block of that period is actually only realised as that block emerges from the delay 4. Thus there is a smoothing of the adjustments to the 3 second blocks by virtue of the shuffling of the data. This minimises any tonal distortion in music as processed by the system.

Figure 4:
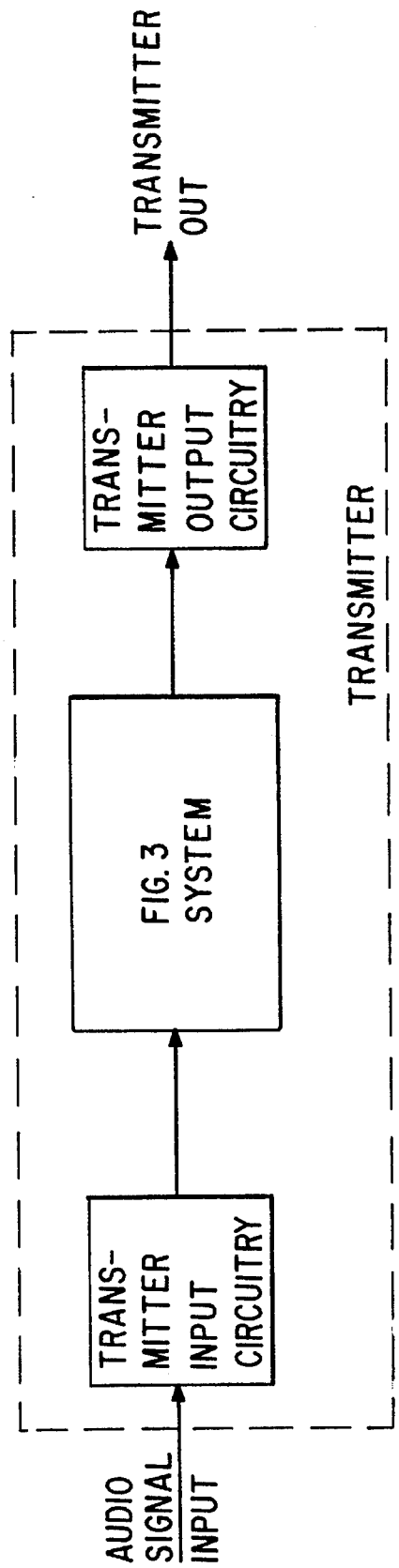
FIG. 4 shows a block diagram of a transmitter in accordance with the invention.
Figure 5:
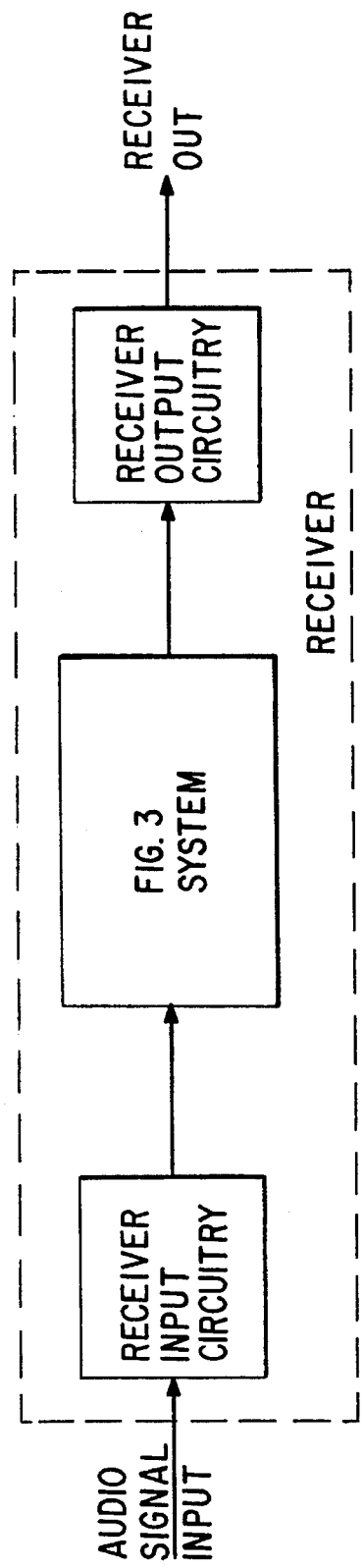
FIG. 5 shows a block diagram of a receiver in accordance with the invention.

The system described with reference to FIG. 3 is, clearly, only a basic system embodying the invention and various modifications are possible to implement the various features of the method which have been discussed. As would be understood by those in the art, the system as shown in FIG. 3 can be used in a transmitter and in a receiver as depicted in FIGS. 4 and 5, respectively.

If such a system were to be used for compressing an audio signal before broadcast emission the various possibilities for transmission discussed above could be used. Firstly the signal could be transmitted in its compressed form, somewhere between full and reduced during dynamic range. Secondly the signal could be transmitted without any gain adjustments made by gain adjuster 6 (i.e. with its full dynamic range) and with the control signal from the gain gradient calculator 18 in a separate data channel. Thirdly the signal could be transmitted with its gain adjusted but with the control signal in the separate data channel and lastly, the signal could be transmitted with its full dynamic range and no control signal, and receivers could be provided with circuitry similar to that in FIG. 3 to give the limiter the option to compress the received signal.

It has been found experimentally that a window length of 20 seconds will produce compression analogous to the Studio Manager's approach. A delay of this length would necessitate the entire piece being previewed before broadcasting, as a delay of this magnitude can not easily be fitted into normal radio operations. The music would have to be recorded onto a computer, processed, played out and rerecorded (e.g. onto Digital Audio Tape) for broadcasting. An easier alternative would be to have a processor in between the compact disc player and the transmission chain, incorporating a much shorter delay, that could compress the music "live". A delay of about 3 seconds would be not too difficult to fit into normal radio programming operations.

During the development of the dynamic range compession technique it was used on many test pieces of different styles of music and a few places were discovered which were particularly diffcult for the technique. Clearly when working with a short look ahead time, the technique's subtletly was restricted when a sudden rise in volume occured. Problems also arose when compressing quiet piano pieces, as the technique was frequently attempting to bring up the gain as a piano chord was slowly dying away, resulting in unnatural sustain. To combat this, a small amount of code was written which recognised a decaying note and held the gain flat during it, if the calculated gain gradient was positive. This dealt with this problem but introduced a "jumpier" gain profile. The rapid changing of gain in this case, however, is largely inaudible and considerably improved the retention of the natural envelope of the piano notes.

The last major development of the method was the inclusion of a user definable compression law. This enbales the input/output relationship to be defined with some accuracy. Initially a compression law was used that only compressed the music outside the compression limits of PPM, 2 and 6, (the first law, as shown in FIG. 1*a*). However, this law tended to impair the dynamics of the music outside these limits too much. When attempting to compress items with an exceptionaly wide dynamic range, a compression law similar to the 3rd law (see FIG. 1*c*) is needed to retain the overall balance of the item. This law, however, causes items of a smaller dynamic range to be compressed more than is necessary to fulfill the Studio Manager's guidelines. After experimentation with these two laws a law was designed that compromised the two extreme situations, the 2nd law, (see FIG. 1*b*) to work well with items of a wide dynamic range without over-compression of those having a smaller dynamic range. Unfortunately, this law performed unfavourably on the most difficult items. For the purposes of broadcasting, a law is needed that copes well with everything, and the 3rd law seems the best contender.

Figure 2A:
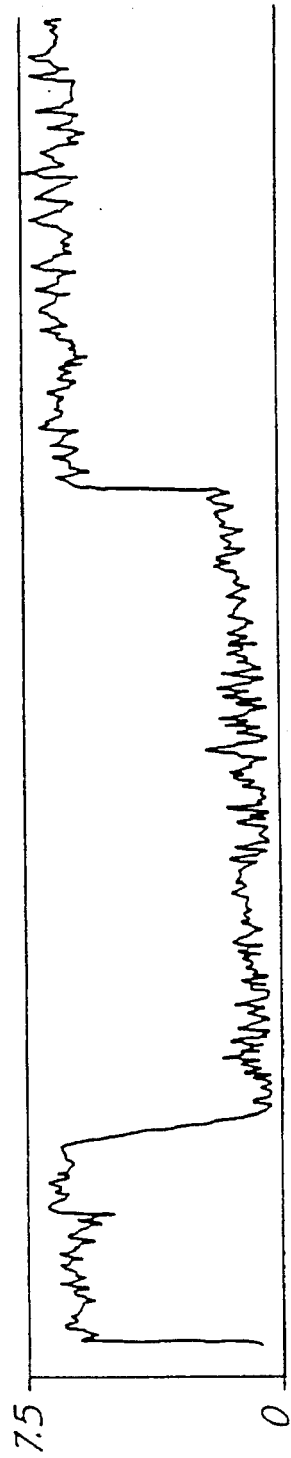
FIGS. 2A, 2B and 2C show plots of typical uncompressed and compressed signal levels.
Figure 2B:
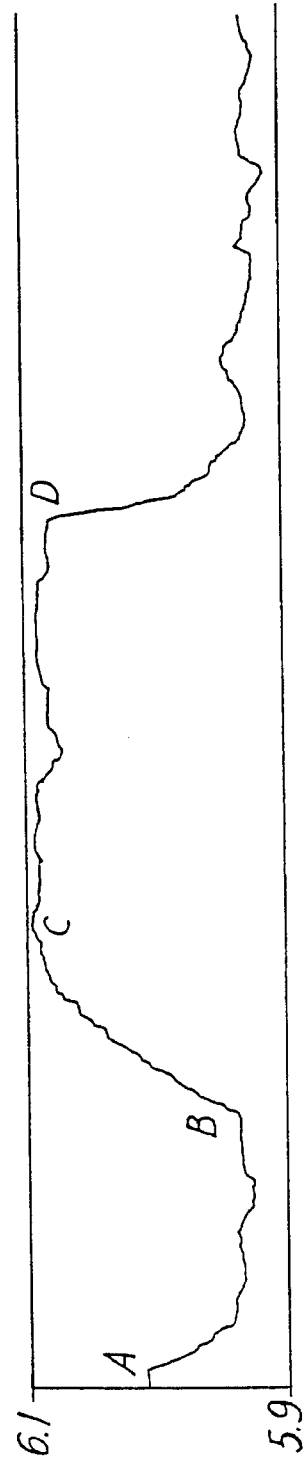
Figure 2C:
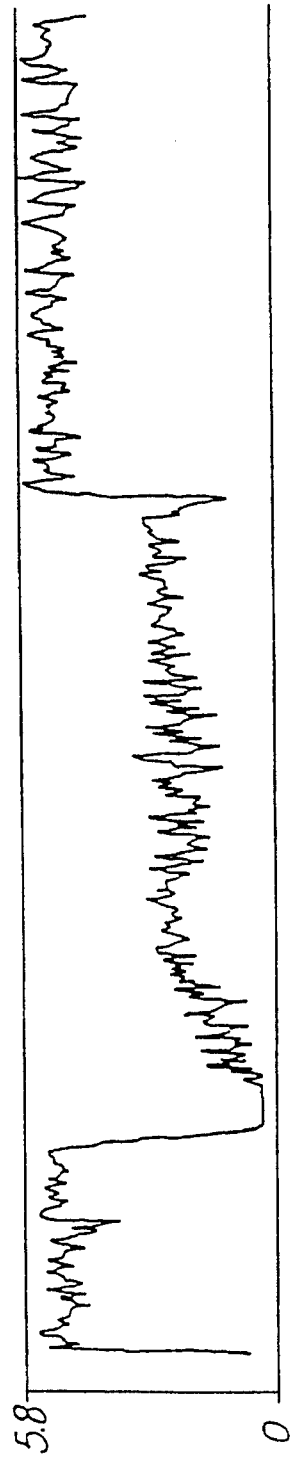

FIGS. 2A–2C are a print out of the compression performed on "O Fortuna" from Carmina Burana by Carl Orff. The first graph shows the envelope of the original item, the second the gain applied, and the third the envelope of the compressed item. The graphs clearly show the compression performed, with more gain being applied in the quiet passage. At point A the method detects a large rise in volume, and brings down the gain to bring the peaks below PPM 6.

The gain continues to fall, until reaching the ideal value for the peaks, coresponding to the compression law. It continues to adjust to the peaks until it reaches point B. Here, it detects a fall in the volume of the audio, and brings up the gain to the ideal value for the peaks gain defined by the compression law. At point C it reaches the ideal gain for the peak in the window at that point. It continues to point D. Here, it detects another large rise in volume, and brings down the gain quickly in the order to bring the peaks under PPM 6. From here on the gain is constantly adjusted to keep the peaks below PPM 6 arid to tend towards the idea gain for the peaks as defined from the compression law.

With a 3 second delay and optimised compression parameters the method performs well, although inevitably some transient dynamics are reduced when a loud sudden transient occurs in the music.

The compressor could be provided as a unit with analoque or digital input and output, and controls for changing a few of the compression parameters, such as the compression law and the maximum rate of change of gain. These controls, although redundant for the majority of the time, would enable the Studio Managers to optimise the machine for different situations, say compression for daytime listening and for listening during rush hour driving. For the majority of situations though, the method should cope well with one set of parameters.

I claim:

1. A method for compressing the dynamic range of an audio signal comprising the steps of sampling a block of the audio signal, deriving an ideal signal level for that block of audio signal, deriving a gain control signal for adjusting the gain applied to that block towards the said ideal signal level, and deriving a further gain control signal to reduce the gain applied to the block when a portion of the block exceeds a predetermined amplitude limit.

2. A method for compressing the dynamic range of an audio signal according to claim 1 in which the step of deriving the ideal signal level comprises determining the maximum signal amplitude in that block and deriving the ideal signal level therefrom.

3. A method for compressing the dynamic range of an audio signal according to claim 1 or 2 in which the ideal signal level is derived from a predetermined compression law.

4. A method for compressing the dynamic range of an audio signal according to claim 1 in which the gain is reduced in suuficient time to prevent the audio signal level exceeding the predetermined amplitude limit.

5. A method for compressing the dynamic range of an audio signal according to claim 1 in which the gain control signal is derived so that the ideal signal level will not be reached until at least the end of that block of the audio signal.

6. A method for compressing the dynamic range of an audio signal according to claim 1 in which the gain control signal is derived so that the ideal signal level will be reached substantially by the end of that block of the audio signal.

7. A method for compressing the dynamic range of an audio signal according to claim 1 in which the gain control signal is derived so as to adjust the gain at a maximum rate of 72 dB per minute.

8. A method for compressing the dynamic range of an audio signal according to claim 1 in which the gain control signal is derived so as to hold the audio signal level substantially constant during transient increases and decreases in amplitude in that block of the audio signal.

9. A method for compressing the dynamic range of an audio signal according to claim 1 in which the audio signal is a digital Signal.

10. A method for compressing the dynamic range of an audio signal according to claim 1 in which the audio signal is an analogue signal.

11. A system for compressing the dynamic range of an audio signal comprising means for sampling a block of the audio signal means for receiving the block of the audio signal and deriving an ideal signal level for that block of the audio signal, means responsive to the ideal signal level for that block for deriving a gain control signal for adjusting the gain applied to that block towards the ideal signal level, means for detecting when the amplitude of the block of the audio signal exceeds a predetermined limit, and means for adjusting the gain control signal such that the gain applied to that block of the audio signal reduces its amplitude to less than the predetermined limit.

12. A system for compressing the dynamic range of an audio signal according to claim 11 in which the ideal signal level deriving means includes means for determining the maximum audio signal amplitude in that block.

13. A system for compressing the dynamic range of an audio signal according to claim 11 in which the ideal signal level deriving means operates according to a predetermined compression law to derive the ideal signal level.

14. A system for compressing the dynamic range of an audio signal according to claim 11 in which the gain control signal deriving means operates such that the ideal signal level will not be reached until at least the end of that block of the audio signal.

15. A system for compressing the dynamic range of an audio signal according to claim 11 in which the gain control signal deriving means operates such that the ideal signal level will be reached substantially by the end of that block of the audio signal.

16. A system for compressing the dynamic range of an audio signal according to claim 11 in which the gain control signal deriving means operates to produce a gain control signal which will adjust the gain substantially at 72 dB per minute.

17. A system for compressing the dynamic range of an audio signal according to claim 11 in which the gain control singal deriving means operates to produce a gain control signal which will hold the audio signal level substantially constant during transient increases and decreases in amplitude in that block of the audio signal.

18. A system for compressing the dynamic range of an audio signal according to claim 11 in which the audio signal is a digital signal.

19. A system for compressing the dynamic range of an audio signal according to claim 11 in which the audio signal is an analogue signal.

20. A dynamic range compression system according to claim 11 connected in a transmitter which includes transmitter input circuitry for receiving an audio signal input and for supplying the audio signal to the dynamic range compression system and transmitter output circuitry for receiving an audio signal from the dynamic range compression system to provide a transmitter output.

21. A dynamic range compression system according to claim 20 wherein said transmitter is operable to transmit from said dynamic range compression system an uncompressed audio signal and a gain control signal derived from said uncompressed audio signal.

22. A dynamic range compression system according to claim 20 wherein said transmitter is operable to transmit from said dynamic range compression system a compressed audio signal and a corresponding gain control signal by which the audio signal was compressed.

23. A method for compressing the dynamic range of an audio signal comprising the steps of sampling a block of the audio signal, deriving an ideal signal level for that block of audio signal, deriving a gain control signal for adjusting the gain applied to that block towards the said ideal signal level, wherein the gain control signal is derived such that the said ideal signal level will not be reached until at least the end of that block of the audio signal.

24. A method for compressing the dynamic range of an audio signal comprising the steps of sampling a block of the audio signal, deriving an ideal signal level for that block of audio signal, deriving a gain control signal for adjusting the gain applied to that block towards the said ideal signal level, wherein the gain control signal is derived such that the said ideal signal level will be reached substantially by the end of that block of the audio signal.

25. A method for compressing the dynamic range of an audio signal comprising the steps of sampling a block of the audio signal, deriving an ideal signal level for that block of audio signal, deriving a gain control signal for adjusting the gain applied to that block towards the said ideal signal level, wherein the gain control signal is derived so as to adjust the gain at a maximum rate of 72 dB per minute.

26. A method for compressing the dynamic range of an audio signal comprising the steps of sampling a block of the audio signal, deriving an ideal signal level for that block of audio signal, deriving a gain control signal for adjusting the gain applied to that block towards the said ideal signal level, wherein the gain control signal is derived so as to hold the audio signal level substantially constant during transient increases and decreases in amplitude in that block of the audio signal.

27. A system for compressing the dynamic range of an audio signal comprising means for sampling a block of the audio signal, means for receiving the block of the audio signal and deriving an ideal signal level for that block of the audio signal, means responsive to the ideal signal level for that block for deriving a gain control signal for adjusting the gain applied to that block towards the ideal signal level, wherein the gain control signal deriving means operates such that the ideal signal level will not be reached until at least the end of that block of the audio signal.

28. A system for compressing the dynamic range of an audio signal comprising means for sampling a block of the audio signal, means for receiving the block of the audio signal and deriving an ideal signal level for that block of the audio signal, and means responsive to the ideal signal level for that block for deriving a gain control signal for adjusting the gain applied to that block towards the ideal signal level, wherein the gain control signal deriving means operates such that the ideal signal level will be reached substantially by the end of that block of the audio signal.

29. A system for compressing the dynamic range of an audio signal comprising means for sampling a block of the audio signal, means for receiving the block of the audio signal and deriving an ideal signal level for that block of the audio signal, means responsive to the ideal signal level for that block for deriving a gain control signal for adjusting the gain applied to that block towards the ideal signal level, wherein the gain control signal deriving means operates to produce a gain control signal which will adjust the gain substantially at 72 dB per minute.

30. A system for compressing the dynamic range of an audio signal comprising means for sampling a block of the audio signal, means for receiving the block of the audio signal and deriving an ideal signal level for that block of the audio signal, means responsive to the ideal signal level for that block for deriving a gain control signal for adjusting the gain applied to that block towards the ideal signal level, wherein the gain control signal deriving means operates to produce a gain control signal which will hold the signal level substantially constant during transient increases and decreases in amplitude in that block of the audio signal.

31. A dynamic range compression system according to claim 11, 27, 28, 29, or 30 connected in a receiver which includes receiver input circuitry for receiving an audio signal input and for supplying the audio signal to the dynamic range compression system and receiver output circuitry for receiving an audio signal from the dynamic range compression system to provide a receiver output.

32. A dynamic range compression system according to claim 31, wherein said receiver is responsive to a received uncompressed audio signal and a gain control signal transmitted by a transmitter, said dynamic range compression system being operable to compress the received uncompressed audio signal in dependence on the received gain control signal.

33. A dynamic range compression system according to claim 31, wherein said receiver is responsive to a compressed audio signal and a gain control signal transmitted by a transmitter, said dynamic range compression system being operable to expand the compressed audio signal substantially to its full dynamic range.

* * * * *